(12) United States Patent
Lam (10) Patent No.: US 12,375,082 B2
(45) Date of Patent: Jul. 29, 2025

(54) DEVICES AND METHODS RELATED TO DIODE SWITCH CONTROL

(71) Applicant: SKYWORKS SOLUTIONS, INC., Irvine, CA (US)

(72) Inventor: Lui Ray Lam, Lexington, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 18/101,139

(22) Filed: Jan. 25, 2023

(65) Prior Publication Data

US 2023/0246644 A1     Aug. 3, 2023

Related U.S. Application Data

(60) Provisional application No. 63/306,143, filed on Feb. 3, 2022.

(51) Int. Cl.
*H03K 17/74*     (2006.01)
*H04B 1/48*     (2006.01)

(52) U.S. Cl.
CPC .............. *H03K 17/74* (2013.01); *H04B 1/48* (2013.01)

(58) Field of Classification Search
CPC ............ H04B 1/48; H04B 1/44; H03K 17/74
See application file for complete search history.

(56) References Cited

U.S. PATENT DOCUMENTS

| | | | |
|---|---|---|---|
| 5,220,679 A * | 6/1993 | Zametzer | H04B 1/48 455/78 |
| 7,129,805 B2 * | 10/2006 | Marion | H01P 1/15 333/103 |
| 7,391,283 B2 * | 6/2008 | Kearns | H01P 1/15 333/262 |
| 2015/0303977 A1 | 10/2015 | Puente et al. | |
| 2016/0261267 A1 * | 9/2016 | Liu | H01L 23/49562 |
| 2021/0135326 A1 * | 5/2021 | Puente | H03K 17/76 |
| 2021/0234028 A1 * | 7/2021 | Detzel | H01L 29/1029 |
| 2022/0006483 A1 * | 1/2022 | Scaccabarozzi | H04B 1/48 |

FOREIGN PATENT DOCUMENTS

JP         2010263575 A  * 11/2010

* cited by examiner

*Primary Examiner* — Patrick C Chen
(74) *Attorney, Agent, or Firm* — Lando & Anastasi, LLP (57) ABSTRACT

Embodiments of the invention relate to a circuit assembly for biasing a PIN diode, wherein a DC biasing voltage is obtained by extracting power from a radio-frequency transmission path. The circuit assembly comprises a PIN diode, an input node configured to receive a radio-frequency input voltage, a rectifying circuit configured to receive the radio-frequency input voltage from the input node and generate a rectified voltage, and a smoothing circuit configured to receive the rectified voltage from the rectifying circuit and generate a DC voltage. The output of the smoothing circuit forms the input to the PIN diode to reverse-bias the diode. Related methods, radio-frequency switching circuits and radio-frequency modules are also provided.

20 Claims, 4 Drawing Sheets

DEVICES AND METHODS RELATED TO DIODE SWITCH CONTROL

CROSS-REFERENCE TO RELATED APPLICATIONS

This application claims priority under 35 U.S.C. § 119(e) to U.S. Provisional Patent Application Ser. No. 63/306,143, titled "DEVICES AND METHODS RELATED TO DIODE SWITCH CONTROL," filed Feb. 3, 2022, the entire contents of which is incorporated herein by reference for all purposes.

BACKGROUND

Field

Aspects and embodiments of the present disclosure relate to the field of wireless communication devices and, more particularly, to devices and methods for controlling diode switches for radio-frequency (RF) applications.

Description of the Related Technology

In some radio-frequency (RF) applications, signals can be routed between various paths. An example is the routing between an antenna and transceiver through, for example, a transmitter path or a receiver path. The routing of RF signals can be facilitated by switches. In some applications, such as high-power applications, these switches include diodes controlled using diode control circuitry.

SUMMARY

According to one aspect of the present disclosure there is provided a circuit assembly for reverse biasing a PIN diode, comprising a PIN diode, an input node configured to receive a radio-frequency input voltage, a rectifying circuit configured to receive the radio-frequency input voltage from the input node and generate a rectified voltage, and a smoothing circuit configured to receive the rectified signal from the rectifying circuit and generate a DC voltage, the output of the smoothing circuit forming the input of the PIN diode to reverse-bias the PIN diode.

In one example the rectifying circuit comprises a diode connected to the input node.

In one example the smoothing circuit comprises a capacitor.

In one example the smoothing circuit further comprises a resistor and an inductor connected to the capacitor.

In one example the DC voltage matches the peak voltage of the radio-frequency input voltage.

According to another aspect there is provided a method for reverse biasing a PIN diode, the method comprising receiving a radio-frequency input voltage, rectifying the received radio-frequency input voltage to generate a rectified voltage, smoothing the rectified voltage to generate a DC voltage, and applying the generated DC voltage to the cathode of the PIN diode to reverse bias the PIN diode.

In one example the radio-frequency input voltage has a frequency in the range of 5 to 24 GHz.

In one example, the input voltage is a high-power radio-frequency signal.

In one example, the radio-frequency signal has a power greater than 100 W.

In one example the DC voltage matches the peak voltage of the radio-frequency input voltage.

According to a further aspect there is provided a radio-frequency switching circuit comprising an antenna port, a transmit port, a receive port, a PIN-diode based switch comprising at least one PIN diode, the PIN diode based switch being configured to selectively connect the antenna port to one of the transmit port and the receive port, and diode bias control circuitry coupled to a PIN diode of the PIN diode based switch, the diode bias control circuitry including an input node configured to receive a radio-frequency input voltage from the transmit port, a rectifying circuit configured to receive the radio-frequency input voltage from the input node and generate a rectified voltage, and a smoothing circuit configured to receive the rectified voltage from the rectifying circuit and generate a DC voltage and output the DC voltage to the cathode of the PIN diode.

In one example the rectifying circuit comprises a diode connected to the input node.

In one example the smoothing circuit comprises a capacitor.

In one example the smoothing circuit further comprises a resistor and an inductor connected to the capacitor.

In one example the DC voltage matches the peak voltage of the radio-frequency input voltage.

In one example, the PIN diode is arranged between the receive port and the transmit port.

According to a further aspect there is provided a radio-frequency module comprising an antenna, a transceiver in communication with the antenna, the transceiver including a transmitter path and a receiver path, a transmit/receive (T/R) switch implemented between the antenna and the transceiver, the T/R switch being configured to selectively connect the antenna to one of the transmitter path and receiver path of the transceiver, the T/R switch including at least one PIN diode and at least one diode bias control circuit associated with the at least one PIN diode, the at least one diode bias control circuit having an input node configured to receive a radio-frequency input voltage from the transmit port, a rectifying circuit configured to receive the radio-frequency input voltage from the transmit port, a rectifying circuit configured to receive the radio-frequency input voltage from the input node and generate a rectified voltage, and a smoothing circuit configured to receive the rectified voltage from the rectifying circuit, generate a DC voltage, and output the DC voltage to the cathode of the PIN diode.

In one example the rectifying circuit comprises a diode connected to the input node.

In one example, the smoothing circuit comprises a capacitor.

In one example, the smoothing circuit further comprises a resistor and inductor connected to the capacitor.

In one example, the DC voltage matches the peak voltage of the radio-frequency input voltage.

In one example, the PIN diode is arranged between the receiver path and the transmitter path.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Aspects and embodiments described herein are directed to devices and methods for controlling a diode, in particular to devices and methods for reverse-biasing a PIN diode. The devices and methods advantageously generate a DC voltage for biasing the PIN diode by processing a radio-frequency input such as a radio-frequency voltage signal sent from a transmitter to an antenna. This allows the PIN diode to be reverse-biased without requiring a dedicated DC voltage supply.

PIN diodes are utilized in a number of radio-frequency (RF) applications, such as applications involving high power RF signals. For example, a PIN diode can be utilized as a fast switch to provide switching functionality in RF applications involving high power signals.

Other components that may be used for switching RF signals are known, such as Metal Oxide Semiconductor Field Effect Transistor (MOSFET) switches. However, PIN diodes are favored due to their low insertion loss when forward-biased, low parasitic capacitance when reverse-biased, and improved power handling. The latter of these benefits makes PIN diodes particularly favorable for high-power RF applications.

To control the passage of RF signals through a PIN diode, the diodes are biased by applying a potential difference across the terminals. When applying a positive bias voltage, known as 'forward-biasing,' the PIN diode has a very low impedance to RF signals. Alternatively, when applying a negative voltage, known as 'reverse biasing,' the PIN diode will behave almost like an open circuit, preventing RF signals from passing.

One of the difficulties faced when designing PIN diode-based RF switching architectures is providing a suitable voltage source for biasing the diodes in the switch. It is known that, particularly in high-power applications, the high voltage is supplied using an external power source such as a DC-DC converter. However, the inventors have appreciated that there are numerous disadvantages in having to rely on an external power supply to generate the required biasing voltage signals. Firstly, when the RF switching circuit is implemented in remote infrastructure such as a base station, requiring a high-voltage external power supply increases the costs associated with installing such infrastructure, since the high-voltage supply must be routed to the base station. Additionally, at an RF module level, the high-voltage bias control signal occupies an additional input pin per module (such as a front-end module). For example, a quad-flat no-leads implementation of a known front-end module (FEMs) may have 16 input and output pins arranged around the periphery of the FEM package, one of which is designated as a dedicated input for high-voltage diode biasing signal.

Figure 1:
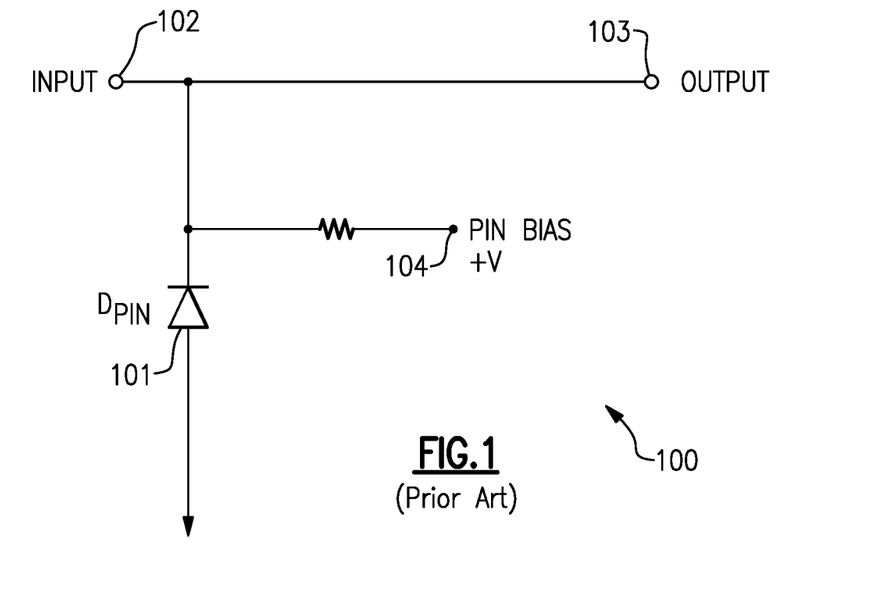
FIG. 1 is a schematic diagram illustrating a known circuit assembly for biasing a PIN diode.

FIG. 1 shows an example of a known circuit assembly used to bias a PIN diode. The PIN diode 101 is shown connected between an input node 102 and an output node 103. In the arrangement shown, the PIN diode 101 is arranged with its cathode terminal facing the input node 102 and output node 103. This arrangement is typically found in switching circuits used in RF applications such as single pole double throw (SPDT) switches utilized in some base station front end modules (FEMs) as will be explained further with regards to FIG. 2. As discussed above, whether RF voltage signals are conducted through the PIN diode 101 depends on the biasing state of the PIN diode 101. In the known circuit assembly of FIG. 1, the biasing state of the PIN diode 101 is controlled by the PIN bias node 104, which is connected to the cathode of the PIN diode 101. The bias state of the PIN diode 104 can be controlled by applying a DC voltage at the PIN bias node 104. As is known, in order to effectively reverse bias a PIN diode to prevent the diode from conducting an alternating current (AC) RF signal, the reverse bias voltage must be greater than or equal to the peak voltage of the RF signal. Accordingly, if the voltage applied at the cathode terminal of the PIN diode 101 is greater than the voltage at the anode terminal of the PIN diode 101, then the PIN diode will be reverse-biased and will block RF signals from flowing through the diode from the input node 102, as long as the peak voltage of the RF signal is less than the voltage applied to the cathode terminal of the PIN diode 101. Otherwise, if the voltage applied at the cathode terminal via the PIN diode bias node 104 is less than the peak voltage of the RF signal, then at least some of the RF signal will be conducted through the PIN diode 101. As shown in FIG. 1, the PIN diode bias node 104 is an external voltage source that applies a voltage to the PIN diode 101.

Figure 2:
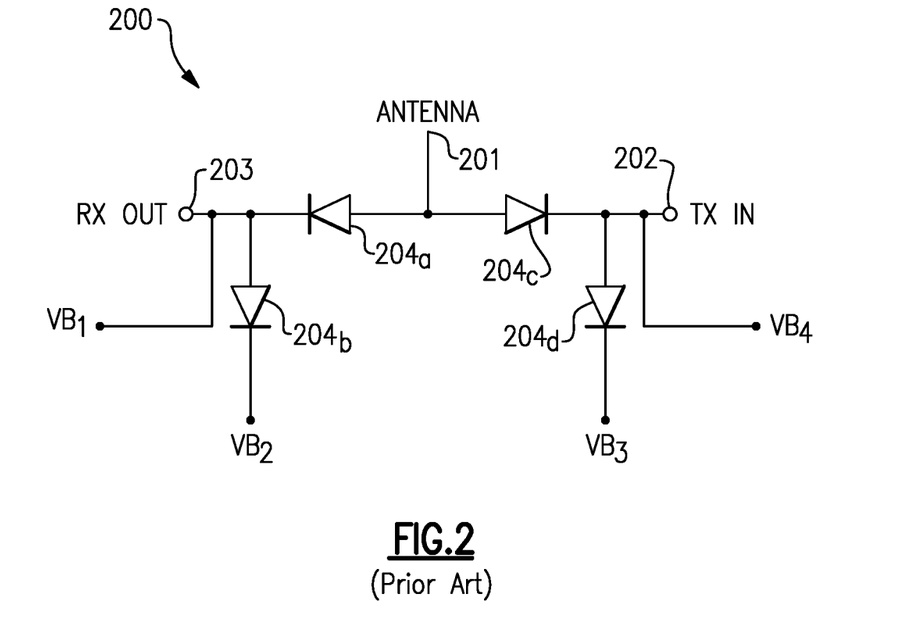
FIG. 2 is a schematic diagram illustrating a known radio-frequency switching circuit.

Shown in FIG. 2 is a simplified schematic diagram of an RF switching circuit 200, showing a typical arrangement of PIN diodes found in such a circuit. In particular, the arrangement of PIN diodes shown is that found in known high-power single-pole, double-throw (SPDT) switches used to switch between transmit and receive modes using a common RF antenna. The switching circuit includes an antenna port 201 connected to a transmit node 202 and a receive node 203. In certain applications, the signal power of the RF signal from the transmit node 202 is relatively high, and therefore the RF switching circuit 200 needs to be able to handle both the high-power signal for transmission and provide sufficient isolation to protect the receiver circuitry beyond the receive node 203 from being damaged by leakage of the high-power transmit signal into the receive path. To provide sufficient isolation between the transmit and receive paths, the RF switching circuit comprises series PIN diodes $204_a$ and $204_c$ connected in series between the antenna and receive nodes and antenna and transmit nodes respectively. The circuit also includes shunt PIN diodes $204_b$ and $204_d$ connected between the antenna and receive/transmit nodes respectively. As shown in FIG. 2, known implementations of the SPDT switch require individual bias control signals for each of the PIN diodes $204_{a-d}$. These are each provided via the PIN diode bias nodes $VB_{1-4}$. As discussed above, the high voltage required for the bias control signals is generated using an external power supply which may comprise, for example, a DC-DC converter.

As discussed above, the requirement for existing PIN diode-based RF switching circuits to have their own dedicated external power supplies can be disadvantageous. A high voltage power supply may not be readily available in a location in which communications infrastructure is to be installed. Providing a dedicated high voltage power supply can increase the costs associated with installing communications infrastructure such as base stations. Generating high voltage using a DC-DC converter requires high-voltage Metal-Oxide Semiconductor (MOS) circuitry. High-voltage MOS circuitry is known to be slower, with poor conversion efficiency. In addition, the high-voltage DC-DC converter requires a storage device such as an inductor, which can further increase the cost of the device. Further, when the RF switching circuit is implemented as a package, such as a QFN package, the high-voltage power supply occupies an input pin for the package. This can be disadvantageous particularly if the QFN package is embedded in a 5G communications system requiring massive Multiple Input Multiple Output (MIMO) and beamforming. Such systems comprise large numbers of components, and one extra pin per FEM would be a significant saving at the antenna level.

It would therefore be advantageous to be able to generate a high-voltage to reverse bias a PIN diode without requiring a dedicated external high-voltage supply. However, the generated reverse bias voltage should be greater than or equal to the peak voltage of the signal that the PIN diode is intended to switch.

Figure 3:
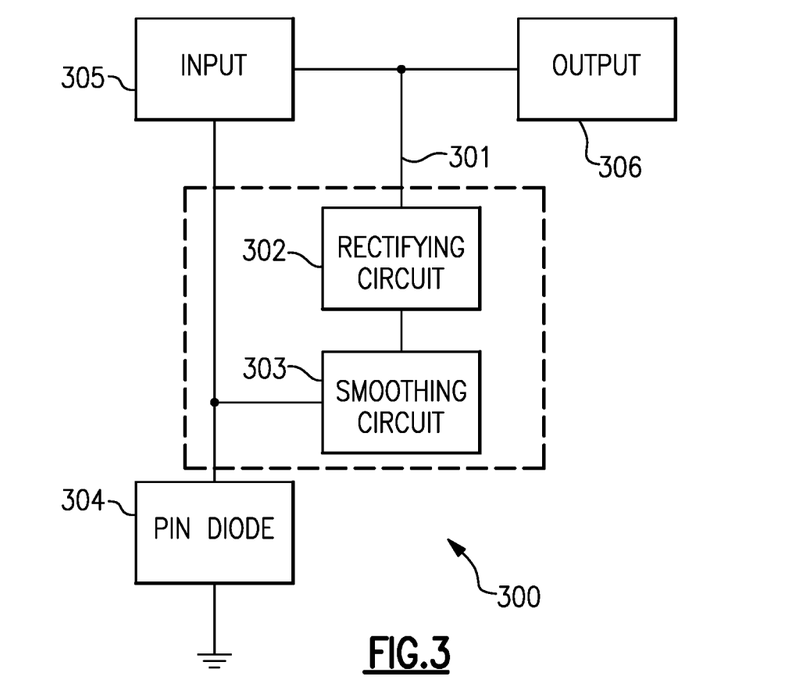
FIG. 3 is a schematic diagram illustrating a circuit assembly for reverse biasing a PIN diode according to aspects of the present disclosure.

FIG. 3 is a schematic diagram showing the fundamental components of a circuit assembly 300 according to the present disclosure. The circuit assembly 300 includes an input node 301, a rectifying circuit 302, and a smoothing circuit 303. The input node 301 may be connected between an input 305 and an output 306. The input 305 may be an RF input, such as a transmitter input configured to generate a high-power RF signal, and output the high-power RF signal via the output 306. The output 306 may be an RF emitter, such as an antenna configured to receive a high-power RF signal from the input 305 and broadcast said signal wirelessly. A PIN diode 304 is also shown connected to the input 305. Although in FIG. 3 the PIN diode 304 is shown having the opposing terminal connected to ground, it will be appreciated that the opposing terminal of the PIN diode 304 may be connected to sensitive electronic circuitry such as that found in the receiver path of a FEM. The PIN diode 304 may be configured to prevent signals from the input 305 from being conducted through the PIN diode 304. In order to prevent the PIN diode 304 from conducting such signals, the PIN diode 304 can be reverse biased with a DC voltage having a voltage value greater than or equal to the peak voltage of the signal.

The input node 301 receives a portion of a signal transmitted from the input to the output. As discussed, the signal may be an alternating current (AC) signal. The signal may be an RF signal. The signal may be a high-power RF signal. The input node 301 receives the signal and provides the signal to the rectifying circuit 302.

The rectifying circuit 302 may be configured to receive an AC input signal, such as a high-power RF signal from the input node 301. The rectifying circuit 302 is configured to convert an oscillating input signal into a single-directional direct current (DC) signal. The output of the rectifying circuit 302 is connected as the input to smoothing circuit 303. The rectifying circuit may include various components used to rectify a given input signal. In some embodiments, the rectifying circuit may comprise a diode. As discussed above, diodes have low resistance to current flowing in one direction and very high resistance to current flowing in the other. When an oscillating signal is applied to the diode, which oscillates above and below zero Volts, the diode will only conduct the portion of the wave moving in the conducting direction of the diode. In some embodiments, the rectifying circuit may comprise a plurality of diodes. The one or more diodes may be selected to have a reverse breakdown voltage that is greater than the expected peak voltage of any input signal. It will be appreciated that the input signal need not necessarily be an oscillating signal that is oscillated above and below zero Volts, and may for example be a level-shifted AC signal oscillating above and below a predetermined DC voltage. In such a case, the rectifying circuit may comprise additional components such as a level shifter configured to shift the level of the input signal back to zero prior to rectification.

The rectified signal output by the rectifying circuit 302 is single-directional, but may still have a significantly time-varying voltage, appearing as a series of half-sine waves of the same polarity. To generate a smooth DC voltage to use as a biasing voltage, the rectified signal output by the rectifying circuit is received by the smoothing circuit 303. The smoothing circuit 303 may be configured to receive the rectified signal and output a smoothed DC voltage. The smooth DC voltage output of the smoothing circuit 303 may be connected to the cathode terminal of a PIN diode, such as PIN diode 304, in order to reverse bias the PIN diode. The smoothing circuit may include various components used to smooth a DC input signal. The smoothing circuit 303 may include a capacitor with one terminal connected with the output of the rectifying circuit 302. The other terminal of the capacitor may be connected to ground. The capacitor may be connected in series with the output of the rectifying circuit 302. In some embodiments, the smoothing circuit 303 may include a plurality of capacitors. The plurality of capacitors may be configured to store charge when current flows through the rectifying circuit 302. In some embodiments, the smoothing circuit 303 may further include one or more resistors configured to further smooth the output of the smoothing circuit 303. The smoothing circuit 303 may further include one or more inductors which may also be configured to smooth the output of the smoothing circuit. The smoothing circuit may comprise other components and circuits, such as one or more filters, one or more voltage amplifiers, and one or more switching circuits. The one or more filters may be configured to remove noise from the input signal. The one or more voltage amplifiers may be configured to increase the voltage of the smoothed DC voltage. The one or more switching circuits may be configured to switch the output of the smoothing circuit to each of a plurality of PIN diodes simultaneously or in a predetermined order. The output of the smoothing circuit is a smoothed DC voltage. The output of the smoothing circuit 303 may be connected to the cathode terminal of PIN diode 304. By connecting the DC voltage to the cathode terminal of PIN diode 304, the PIN diode 304 will be reverse-biased at that DC voltage. This will prevent the PIN diode from switching on and conducting any RF signal with a peak voltage less than the DC bias voltage.

As shown, the input node 301 of the circuit assembly 300 is connected between the input 305 and output 306, which may be an input and output that are contained within an RF system such as a transmitter node and an antenna within an RF FEM. Accordingly, the DC voltage generated by the circuit assembly shown in FIG. 3 is generated by taking power from within the system, without requiring an external dedicated power supply.

Figure 4:
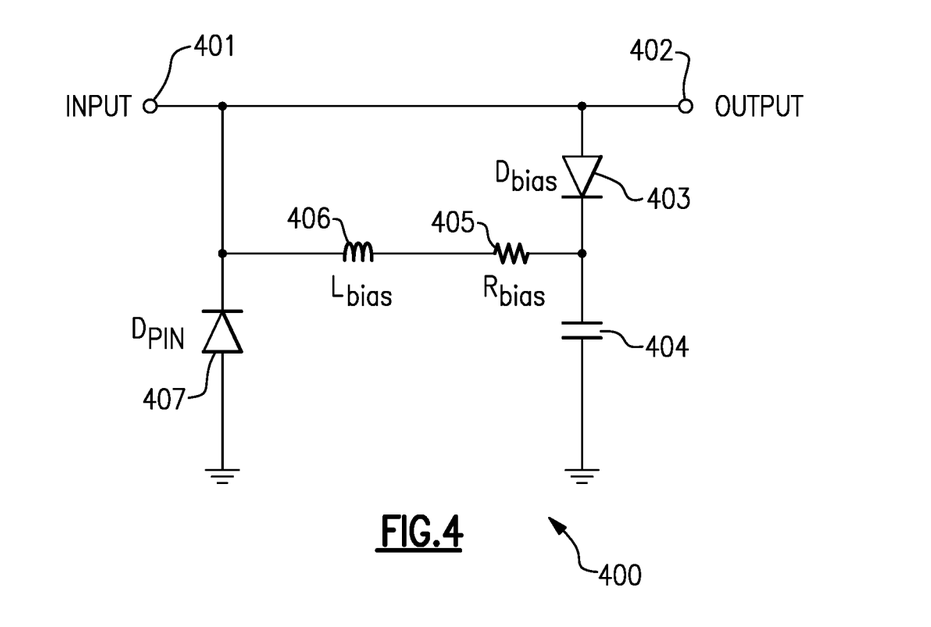
FIG. 4 is a schematic diagram illustrating another circuit assembly for reverse biasing a PIN diode according to aspects of the present disclosure.

FIG. 4 shows a circuit assembly 400. The configuration of circuit assembly 400 is based on that of FIG. 3, but circuit assembly 400 shows examples of actual electrical components that may be used in accordance with the present disclosure. Circuit assembly 400 includes a bias diode 403 ($D_{bias}$), capacitor 404, resistor 405 ($R_{bias}$), inductor 406 ($L_{bias}$), and PIN diode 407 ($D_{PIN}$). The circuit assembly 400 is shown connected between an input node 401 and output node 402.

Input node 401 may emit oscillating signals, such as high-power RF signals. For example, input node 401 may be connected to the output of a transmitter path comprising signal generators and amplifiers. The output node 402 may be configured to receive oscillating signals from the input node 401 and output said signals. For example, the output node 402 may be an antenna node configured to receive high-power RF signals from a transmitter node and output the high-power RF signals to an antenna.

Bias diode 403 is connected in parallel between the input node 401 and output node 402. Bias diode 403 may be configured to have a lower turn-on voltage than PIN diode 407. The bias diode 403 is connected such that the anode of the bias diode 403 is closest to the input node 401, thereby a positive voltage generated from the input node 401 will allow current to flow through the bias diode 403. On the other hand, if a negative voltage is generated from the input node 401, no current will flow through bias diode 403. Accordingly, if a high-power RF signal is generated from the input node 401, the bias diode 403 will conduct the positive region of the RF signal and block the negative.

Capacitor 404 is connected in series with the bias diode 403. One contact of the capacitor 404 is connected to the cathode of the bias diode 403 and the other contact is connected to ground. The capacitor 404 is arranged such that charge flowing through the bias diode 403 can be stored by capacitor 404. As shown, the capacitor 404 is connected between the cathode of bias diode 403 and a reference voltage, e.g., ground. When the bias diode 403 is forward biased by a positive voltage from input node 401, the capacitor 404 will store charge, and if the voltage measured at the anode terminal of the bias diode 403 falls below that of the charged capacitor 404, the capacitor 404 will discharge via the output.

Resistor 405 and inductor 406 are connected in series to the output of capacitor 404. Resistor 405 and inductor 406 are configured to receive the output signal from the capacitor 404 and further smooth the output, and prevent the capacitor 404 from discharging too rapidly. It will be appreciated that the values of the resistor and capacitor may be selected to meet the requirements of the system and will depend on the larger system in which the circuit assembly 400 is installed. Merely by way of example, in some embodiments the resistor 405 may be a 1 KOhm resistor, and the inductor 406 may be a 20 nH inductor.

The output of resistor 405 and inductor 406 is connected to the cathode terminal of PIN diode 407. By connecting the cathode terminal of the PIN diode 407 to an output of the inductor 406, when a positive voltage is applied via the resistor 405 and inductor 406 and applied to the cathode, the PIN diode 407 will be reverse-biased (referred to as "switched OFF").

As is known, a high-power RF signal is generally sinusoidal in nature, having a voltage that varies over time in a sinusoidal nature between a positive peak voltage and opposing negative peak voltage.

When a high-power RF signal is generated at input node 401, the circuit assembly 400 reverse-biases the PIN-diode 407 at a DC voltage equal to the peak voltage of the high-power RF signal, such that no signal can leak through the PIN diode 407 when the high-power RF signal is being transmitted from the input node 401 via output node 402.

During the positive region of the high-power RF signal, the bias diode 403 experiences a positive voltage, and is forward biased allowing current to flow through the bias diode 403. When current flows through the bias diode 403, charge is stored on the capacitor 404 up to a maximum value where the voltage across the capacitor 404 is equal to the peak voltage of the RF signal. Subsequently, during the negative region of the high-power RF signal, the bias diode 403 becomes reverse-biased due to the negative signal voltage, as well as the voltage across the capacitor 404, and therefore no current flows through the bias diode 403. Accordingly, the bias diode 403 outputs a rectified single-directional DC voltage to the capacitor. When the bias diode 403 is reverse biased, the capacitor 404 discharges and applies a smoothed DC voltage through the resistor 405 and inductor 406 to reverse-bias the PIN-diode.

The combination of bias diode 403 and capacitor 404 may be referred to as "peak detector", because when an oscillating AC signal such as a high-power RF signal is received by the bias diode 403 and capacitor 404, the capacitor is charged to the peak voltage of the high-power RF signal. This is particularly advantageous in applications where the generated DC voltage is used to reverse bias a PIN diode to isolate certain circuit elements from the high-power signal, since the reverse bias voltage applied to the PIN diode will be automatically set at the peak voltage of the high-power signal. It is known that in RF communications applications the generated high-power RF signals may have some degree of modulation. Typically, the generated high-power RF signals will have a peak-to-average power ratio of between 8 and 10 decibels. Because the generated DC bias voltage is automatically set at the peak voltage of the RF signal, the circuit assembly 400 is able to cope with modulated RF signals and maintain a sufficient bias voltage to keep the PIN diode 407 reverse biased (switched OFF) and prevent high-power signal from leaking through the PIN diode 407.

Figure 5:
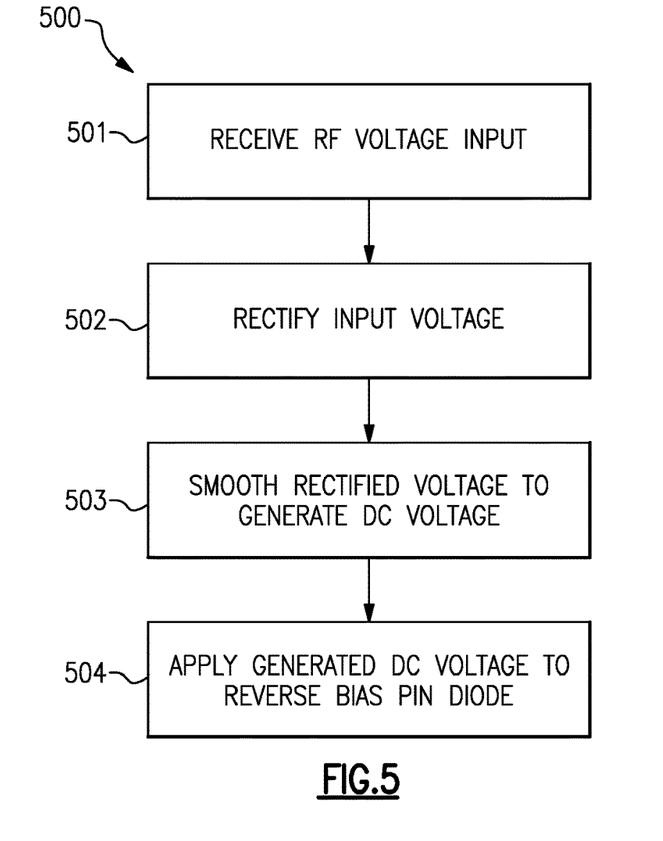
FIG. 5 is a flow diagram showing a method of reverse biasing a PIN diode according to aspects of the present disclosure.

FIG. 5 illustrates steps of a method 500 of reverse biasing a PIN diode according to the present disclosure. The method 500 may be performed by the circuit assemblies, RF switching circuits and RF modules of the present disclosure.

The method comprises receiving 501 an RF voltage input. The RF voltage input may be a high-power RF voltage input, for example an RF voltage input having a power greater than 100 W. In some examples, such as those utilized in advanced 5GE and 5G infrastructure systems, the RF voltage input may have a power in the range 100 W to 320 W. The RF voltage input may be a high-power RF signal sent from the transmission path of an RF transceiver to be broadcast via an antenna. The frequency of the RF voltage input may be in the range of between 20 kHz to 300 GHz, or between 20 kHz and 54 GHz, or between 3.3 GHz and 4.2 GHz, or between 24 GHz and 54 GHz.

The method further comprises rectifying 502 the received input voltage. The received RF input voltage may have a sinusoidal alternating voltage that oscillates between a positive peak voltage value and an opposing negative peak voltage value. The received RF input voltage is rectified such that the resulting rectified voltage is a single-directional DC voltage. The rectifying 502 may be performed by passing the received RF input voltage through a diode. The resulting rectified voltage may still alternate, between zero volts and the peak voltage value. The rectifying 502 may, for example, comprise a half-wave rectification process, or a full-wave rectification process.

The method further comprises smoothing 503 the rectified voltage to generate a DC voltage. As discussed above, the rectified voltage may be a single-directional DC voltage, but may still oscillate between zero Volts and the peak voltage value. The rectified voltage is smoothed such that the amplitude of oscillation is reduced, and the resulting smoothed voltage is a smoothed DC voltage. The smoothing 503 may be performed by one or more capacitors. Further smoothing may be performed by passing the smoothed DC voltage through one or more resistors and/or one or more inductors. The resulting voltage is a smoothed DC voltage having a voltage value that corresponds to the peak voltage of the received RF voltage input.

The method further comprises applying 504 the generated smoothed DC voltage to reverse bias a PIN diode. The smoothed DC voltage may be applied to the cathode of a PIN diode, thereby reverse-biasing the PIN diode at a reverse bias voltage that corresponds to the peak voltage of the received RF input voltage.

Figure 6:
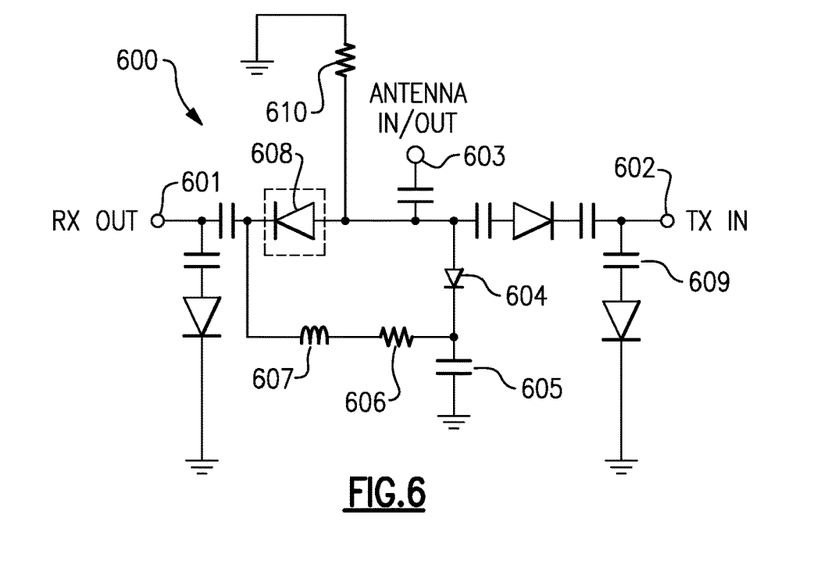
FIG. 6 is a schematic diagram illustrating an example of a radio-frequency switching circuit according to aspects of the present disclosure.

FIG. 6 shows an RF switching circuit 600 according to an embodiment of the present disclosure. The RF switching circuit comprises a receive port 601, a transmit port 602, and an antenna port 603. Connected between the receive port 601, transmit port 602, and antenna port 603 is a PIN diode-based switch comprising at least one PIN diode 608.

Such a topology can be implemented as a single-pole-double-throw (SPDT) with transmit and receive switching paths (receive port 601 and transmit port 602 as the two throws) from a single common antenna port (antenna port 603 as the single pole). As shown in FIG. 6, RF switching circuit 600 may include blocking capacitors 609 connected between the antenna port 603, receive port 601 and transmit port 602 to prevent passage of direct current, while allowing passage of alternating current. In a transmit state, a signal path between antenna port 603 and transmit port 602 can be achieved by forward biasing the series PIN diode on the transmit side and reverse biasing the series PIN diode 608 on the receive side and the shunt PIN diode on the transmit side. In a receive state, a signal path between antenna port 603 and receive port 601 can be achieved by forward biasing the series PIN diode 608 on the receive side and reverse biasing the series PIN diode on the transmit side and the shunt PIN diode on the receive side. DC bias circuitry 610 may be connected to the anode side of PIN diode 608, to hold PIN diode 608 in a forward-bias state when the RF switching circuit 600 is in a receive mode. When the RF switching circuit 600 is in a transmit state, it is important to sufficiently isolate the receive port 601 from the transmit signal path. This is because typically the RF signals transmitted from the transmit port 602 and the antenna port 603 are high-power RF signals, which would damage the more sensitive receiver-side electronics that may be connected to the receive port 601. In the example shown, it will be appreciated that the DC biasing circuitry 610 may be excluded, and replaced with a DC bias-voltage generating circuit according to the present disclosure. The shunt PIN diode on the transmit side may or may not be present. The purpose of the shunt PIN diodes on either the transmit or receive side are to provide further isolation of the transmit port 602 or receive port 601. However, the transmitter-side electronics that may be connected to the transmit port 602 are likely to be capable of withstanding high power RF signals, and therefore are unlikely to be damaged by the generally low-power RF signals received at the receive port 601 via the antenna port 603 when the RF switching circuit 600 is in a receive state.

RF switching circuit 600 further comprises a diode bias control circuit. The diode bias control circuit may comprise a bias diode 604, capacitor 605, resistor 606, and inductor 607. Bias diode 604 may be configured to have a lower turn-on voltage than PIN diode 608. The diode bias circuit may be configured to generate a DC voltage to reverse bias the series PIN diode 608 by receiving an RF input voltage from the transmit node 602 on the transmit path. The function of the diode bias circuit is as described previously with respect to the circuit assembly 400 shown in FIG. 4. By providing the RF switching circuit 600 having the diode bias circuit according to the present disclosure, improved isolation of the receive port 601 from the transmit path is achieved. Whenever an RF signal is transmitted from the transmit port 602 along that transmit path to the antenna port 603, the diode bias circuit generates a DC voltage and applies it to reverse bias the series PIN diode 608 on the receive path. As set out previously, the generated DC voltage matches the peak voltage of the received RF input voltage (the transmitted RF signal), and therefore the diode bias circuit ensures that the PIN diode 608 remains reverse biased while the RF signal is being transmitted from the transmit node 602.

The diode bias control circuit may be configured to apply the generated DC voltage to more than one PIN diode within the RF switching circuit 600. The diode bias control circuit may further comprise a switch circuit configured to selectively apply the generated DC voltage to each of a plurality of PIN diodes. The RF switching circuit 600 may comprise a plurality of diode bias control circuits. Each of the one or more diode bias circuits may be associated with one or more PIN diodes to provide a DC voltage to reverse or forward bias the one or more PIN diodes.

Figure 7:
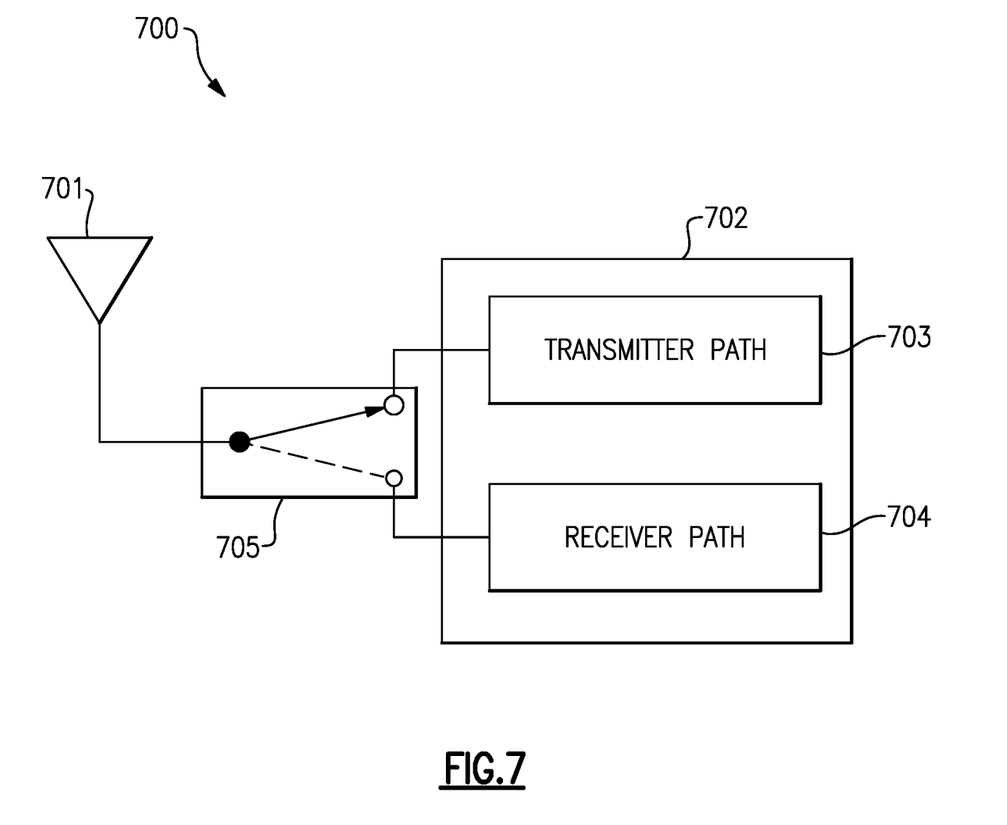
FIG. 7 is a schematic diagram illustrating an example of a radio-frequency module according to aspects of the present disclosure.

FIG. 7 shows an RF module 700 according to an aspect of the present disclosure. The RF module 700 comprises an antenna 701 connected to a transceiver 702 via a transmit/receive (T/R) switch 705. The transceiver includes a transmitter path 703 and a receiver path 704.

In the example RF module 700, the T/R switch 705 may be implemented using one or more PIN diodes, implemented as described herein. The T/R switch 705 can allow use of a common antenna 701 for transmit and receive operations.

As shown in FIG. 7, the RF module 700 can include a transmitter path 703 configured to generate, amplify, filter, and transmit an RF signal. Such an RF signal can be generated from a baseband subsystem and an upconverter. The RF signal can then be filtered (e.g., by a band-pass filter) before being amplified by a power amplifier (PA). The amplified RF signal can further be filtered (e.g., by an additional band-pass filter) and be provided to the T/R switch 705 to be routed to the antenna 701.

The RF module 700 can further include a receiver path 704 configured to receive, amplify, filter, and process an RF signal. A received signal from the antenna 701 can be routed to the receiver path 704 by the T/R switch 705 to a band-pass filter to filter the received signal, then to a low-noise amplifier (LNA) to amplify it. The output of the LNA can be filtered further (e.g., using a further band-pass filter), and the filtered signal can be converted to an intermediate frequency (IF) signal for further processing. Such a conversion may be facilitated by a mixer, a local oscillator, and a filter.

As discussed herein, it is preferable to isolate the receive path 704 from the transmit path 703 when the RF module 700 is transmitting RF signals from the transmit path 703, particularly when those RF signals are high-power RF signals. The T/R switch 705 may include one or more PIN diodes, with one or more diode bias control circuits associated with the one or more PIN diodes. The one or more diode bias control circuits may be implemented in accordance with the diode bias control circuit described above with respect to RF switching circuit 600. Accordingly, when an RF signal is being routed from the transmitter path 703 to the antenna 701, the one or more diode bias control circuits generate DC voltage to reverse bias one or more PIN diodes connected between the receiver path 704 and the transmitter path 703, thereby isolating and protecting the sensitive components (such as the LNA) from high-power RF signals. As discussed, this DC bias voltage is generated without need of an external power supply, since the power is taken from the transmitted RF signal itself.

The inventors have appreciated that taking power from the transmitted RF signal to generate a diode bias control signal for reverse biasing a diode is advantageous, particularly when RF module 700 is implemented as a high-power infrastructure application such as a base station. RF signals transmitted from a base station are typically high power, in some cases above 100 W, and in advanced 5GE and 5G systems up to 320 W. There is therefore an abundance of power available on the transmitter side, that can be leveraged to generate the bias voltage to bias PIN diodes within RF switching circuits. Therefore, embodiments of the present invention are able to generate the required bias voltage without requiring a dedicated high-voltage supply, thus rendering RF module 700 more readily deployable.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

While specific embodiments of, and examples for, the invention are described above for illustrative purposes, various equivalent modifications are possible within the scope of the invention, as those ordinary skilled in the relevant art will recognize in view of the disclosure herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency switching circuit comprising:
   an antenna port, a transmit port, and a receive port;
   a PIN-diode based switch comprising a first PIN-diode and a second PIN-diode, the PIN-diode based switch being configured to selectively connect the antenna port to one of the receive port through the first PIN-diode and the transmit port through the second PIN-diode; and diode bias control circuitry coupled to the first PIN diode and the second PIN diode of the PIN-diode based switch, the diode bias control circuitry including an input node coupled to the transmit port through the second PIN-diode, a rectifying circuit configured to receive a radio-frequency input voltage from the input node and generate a rectified voltage, and a smoothing circuit including a first connection and a second connection different than the first connection, the smoothing circuit being configured to receive the rectified voltage from the rectifying circuit through the first connection and generate a DC voltage and output the DC voltage to a cathode of the first PIN-diode through the second connection.

2. The radio-frequency switching circuit of claim 1 wherein the rectifying circuit includes a diode connected to the input node.

3. The radio-frequency switching circuit of claim 2 wherein the smoothing circuit includes a capacitor.

4. The radio-frequency switching circuit of claim 3 wherein the smoothing circuit further includes a resistor and an inductor connected to the capacitor.

5. The radio-frequency switching circuit of claim 1 wherein the DC voltage matches the peak voltage of the radio-frequency input voltage.

6. The radio-frequency switching circuit of claim 1 wherein the first PIN-diode and the second PIN-diode are arranged between the receive port and the transmit port.

7. The radio-frequency switching circuit of claim 1 wherein the radio-frequency switching circuit further comprises:
a first shunt PIN-diode coupled to the receive port and a reference node; and
a second shunt PIN-diode coupled to the transmit port and the reference node.

8. The radio-frequency switching circuit of claim 1 further comprising:
second diode bias control circuitry coupled to the first PIN-diode and the second PIN-diode of the PIN-diode based switch, the second diode bias control circuitry including a second input node coupled to the receive port through the first PIN-diode, a second rectifying circuit configured to receive a second radio-frequency input voltage from the second input node and generate a second rectified voltage, and a second smoothing circuit configured to receive the second rectified voltage from the second rectifying circuit and generate a second DC voltage and output the second DC voltage to a cathode of the second PIN-diode.

9. The radio-frequency switching circuit of claim 2 wherein the diode has a lower turn-on voltage than the first PIN-diode.

10. A radio-frequency module comprising:
an antenna;
a transceiver in communication with the antenna, the transceiver including a transmitter path and a receiver path; and
a transmit/receive (T/R) switch implemented between the antenna and the transceiver, the T/R switch being configured to selectively connect the antenna to one of the transmitter path and the receiver path of the transceiver, the T/R switch including a first PIN-diode and a second PIN-diode and at least one diode bias control circuit associated with the first PIN-diode and the second PIN-diode;
the at least one diode bias control circuit having an input node coupled to the transmitter path through the second PIN-diode, a rectifying circuit configured to receive a radio-frequency input voltage from the input node and generate a rectified voltage, and a smoothing circuit including a first connection and a second connection different than the first connection, the smoothing circuit being configured to receive the rectified voltage from the rectifying circuit through the first connection and generate a DC voltage and output the DC voltage to a cathode of the first PIN-diode through the second connection.

11. The radio-frequency module of claim 10 wherein the rectifying circuit includes a diode connected to the input node.

12. The radio-frequency module of claim 11 wherein the smoothing circuit includes a capacitor.

13. The radio-frequency module of claim 12 wherein the smoothing circuit further includes a resistor and an inductor connected to the capacitor.

14. The radio-frequency module of claim 11 wherein the diode has a lower turn-on voltage than the first PIN-diode.

15. The radio-frequency module of claim 10 wherein the DC voltage matches the peak voltage of the radio-frequency input voltage.

16. The radio-frequency module of claim 10 wherein the first PIN-diode and the second PIN-diode are arranged between the receiver path and the transmitter path.

17. The radio-frequency module of claim 10, wherein the radio-frequency module is implemented as a base station.

18. The radio-frequency module of claim 10 wherein the radio-frequency module is implemented as a 5GE or 5G infrastructure module.

19. The radio-frequency module of claim 10 wherein the transceiver further comprises:
a first shunt PIN-diode coupled to the receive path and a reference node, and
a second shunt PIN-diode coupled to the transmit path and the reference node.

20. The radio-frequency module of claim 10 further comprising:
second diode bias control circuitry coupled to the first PIN-diode and the second PIN-diode of the PIN-diode based switch, the second diode bias control circuitry including a second input node coupled to the receive path through the first PIN-diode, a second rectifying circuit configured to receive a second radio-frequency input voltage from the second input node and generate a second rectified voltage, and a second smoothing circuit configured to receive the second rectified voltage from the second rectifying circuit and generate a second DC voltage and output the second DC voltage to a cathode of the second PIN-diode.

* * * * *